United States Patent [19]

Tsu et al.

[11] Patent Number: 5,567,241

[45] Date of Patent: Oct. 22, 1996

[54] METHOD AND APPARATUS FOR THE IMPROVED MICROWAVE DEPOSITION OF THIN FILMS

[75] Inventors: David V. Tsu, Rochester Hills; Rosa Young, Troy; Stanford R. Ovshinsky, Bloomfield Hills, all of Mich.

[73] Assignee: Energy Conversion Devices, Inc., Troy, Mich.

[21] Appl. No.: 442,146

[22] Filed: May 16, 1995

Related U.S. Application Data

[62] Division of Ser. No. 56,156, Apr. 30, 1993, abandoned.

[51] Int. Cl.⁶ .................................................. C23C 16/00
[52] U.S. Cl. ........................ 118/723 MW; 118/723 ME; 204/298.38; 156/345
[58] Field of Search ................ 118/723 MP, 723 ME, 118/723 MR, 723 MW; 156/345; 204/298.38; 313/231.31, 231.41; 315/111.21

[56] References Cited

U.S. PATENT DOCUMENTS

| | | | |
|---|---|---|---|
| 4,339,326 | 7/1982 | Hirose et al. | 204/298.38 |
| 4,512,868 | 4/1985 | Fujimura et al. | 204/298.38 |
| 4,952,273 | 8/1990 | Popov | 156/643 |
| 5,134,965 | 8/1992 | Tokuda et al. | 118/723 |
| 5,270,616 | 12/1993 | Itatani | 315/111.21 |
| 5,276,386 | 1/1994 | Watanabe et al. | 315/111.21 |
| 5,342,472 | 8/1994 | Imahashi et al. | 156/345 |
| 5,356,672 | 10/1994 | Schmitt, III et al. | 118/723 ME |
| 5,364,519 | 11/1994 | Fujimura et al. | 204/298.38 |
| 5,411,591 | 5/1995 | Izu et al. | 118/718 |
| 5,449,412 | 9/1995 | Pinneo | 118/723 ME |

FOREIGN PATENT DOCUMENTS 2245600  1/1992  United Kingdom ........... 118/723 ME

*Primary Examiner*—R. Bruce Breneman
*Assistant Examiner*—Juni Y. Chang
*Attorney, Agent, or Firm*—David W. Schumaker; Marvin S. Siskind; Marc J. Luddy

[57] ABSTRACT

A first aspect of the present invention is an improved microwave vacuum feed-through device for coupling microwave energy from a microwave wave guide in a substantially atmospheric pressure region into an elongated linear microwave applicator in a sub-atmospheric pressure region. The improved feed-through is designed to match the impedance of the microwave wave guide in the atmospheric pressure region and the improved linear microwave applicator. A second aspect of the present invention is an improved linear microwave applicator for uniformly coupling 95% or more of the microwave energy input thereto into an elongated plasma zone. The applicator includes curved microwave reflector panels which are used to tune the uniformity of the radiated microwave energy along the length of the linear applicator. A third aspect of the present invention is a microwave enhanced chemical vapor deposition method for depositing thin film material. The method includes a step of intensifying the kinetic/thermal energy of the electrically neutral species in the plasma by intensifying the kinetic/thermal energy of the ions in the plasma and thereby, through ion-neutral collisions, intensifying the kinetic/thermal energy of the electrically neutral species. The step of intensifying the kinetic/thermal energy of the ions in the plasma includes subjecting the plasma to either a very low frequency alternating current electrical bias or an alternating polarity magnetic field, the frequency of thereof being less than about 100 kHz.

12 Claims, 3 Drawing Sheets

METHOD AND APPARATUS FOR THE IMPROVED MICROWAVE DEPOSITION OF THIN FILMS

This application is a divisional of application Ser. No. 08/056,156 filed on Apr. 30, 1993, now abandoned.

FIELD OF THE INVENTION

This invention relates generally to apparatus and methods used to make amorphous semiconductor alloys and devices having high quality photoresponsive characteristics. The invention more particularly relates to novel apparatus for and methods of making such alloys and devices by plasma deposition from reaction gases. The apparatus including a novel microwave vacuum feed-through and an improved linear microwave applicator. The improved method includes exciting plasmas by a combination of very low frequency alternating electrical or magnetic bias and conventional microwave energy.

BACKGROUND OF THE INVENTION

Silicon is the basis of the huge crystalline semiconductor industry and is the material which has produced expensive high efficiency (18 percent) crystalline solar cells for space applications. When crystalline semiconductor technology reached a commercial state, it became the foundation of the present huge semiconductor device manufacturing industry. This was due to the ability of the scientist to grow substantially defect-free germanium and particularly silicon crystals, and then turn them into extrinsic materials with p-type and n-type conductivity regions therein. This was accomplished by diffusing into such crystalline material parts per million of donor (n) or acceptor (p) dopant materials introduced as substitutional impurities into the substantially pure crystalline materials, to increase their electrical conductivity and to control their being either of a p or n conduction type. The fabrication processes for making p-n junction crystals involve extremely complex, time consuming and expensive procedures. Thus, these crystalline materials useful in solar cells and current control devices are produced under very carefully controlled conditions by growing individual single silicon or germanium crystals, and when p-n junctions are required, by doping such single crystals with extremely small and critical amounts of dopants.

These crystal growing processes produce such relatively small crystals that solar cells require the assembly of many single crystals to encompass the desired area of only a single solar cell panel. The amount of energy necessary to make a solar cell in this process, the limitation caused by the size limitations of the silicon crystal, and the necessity to cut up and assemble such a crystalline material have all resulted in an impossible economic barrier to the large scale use of the crystalline semiconductor solar cells for energy conversion. Further, crystalline silicon has an indirect optical edge which results in poor light absorption in the material. Because of the poor light absorption, crystalline solar cells have to be at least 50 microns thick to absorb the incident sunlight. Even if the single crystal material is replaced by poly-crystalline silicon with cheaper production processes, the indirect optical edge is still maintained; hence the material thickness is not reduced. The polycrystalline material also involved the addition of grain boundaries and other problem defects.

In summary, crystal silicon devices have fixed parameters which are not variable as desired, require large amounts of material, are only producible in relatively small areas and are expensive and time consuming to produce. Devices based upon amorphous silicon can eliminate these crystal silicon disadvantages. Amorphous silicon has an optical absorption edge having properties similar to a direct gap semiconductor and only a material thickness of one micron or less is necessary to absorb the same amount of sunlight as the 50 micron thick crystalline silicon. Further, amorphous silicon can be made faster, easier and in larger areas than can crystalline silicon.

Accordingly, a considerable effort has been made to develop processes for readily depositing amorphous semiconductor alloys or films, each of which can encompass relatively large areas, if desired, limited only by the size of the deposition equipment, and which could be readily doped to form p-type and n-type materials where p-n junction devices are to be made therefrom equivalent to those produced by their crystalline counterparts. For many years, such work was substantially unproductive. Amorphous silicon or germanium (Group IV) films are normally four-fold coordinated and were found to have microvoids and dangling bonds and other defects which produce a high density of localized states in the energy gap thereof. The presence of a high density of localized states in the energy gap of amorphous silicon semiconductor films results in a low degree of photoconductivity and short carrier lifetime, making such films unsuitable for photoresponsive applications. Additionally, such films cannot be successfully doped or otherwise modified to shift the Fermi level close to the conduction or valence bands, making them unsuitable for making p-n junctions for solar cell and current control device applications.

In an attempt to minimize the aforementioned problems involved with amorphous silicon and germanium, W. E. Spear and P. G. Le Comber of Carnegie Laboratory of Physics, University of Dundee, in Dundee, Scotland, did some work on "Substitutional Doping of Amorphous Silicon", as reported in a paper published in Solid State Communications, Vol. 17, pp. 1193–1196, 1975, toward the end of reducing the localized states in the energy gap in amorphous silicon or germanium to make the same approximate more closely intrinsic crystalline silicon or germanium and or substitutionally doping the amorphous materials with suitable classic dopants, as in doping crystalline materials, to make them extrinsic and of p or n conduction types.

The reduction of the localized states was accomplished by glow discharge deposition of amorphous silicon films wherein a gas of silane ($SiH_4$) was passed through a reaction tube where the gas was decomposed by an r.f. glow discharge and deposited on a substrate at a substrate temperature of about 500°–600° K. (227°–327° C.). The material so deposited on the substrate was an intrinsic amorphous material consisting of silicon and hydrogen. To produce a doped amorphous material a gas of phosphine ($PH_3$) for n-type conduction or a gas of diborane ($B_2H_6$ for p-type conduction were premixed with the silane gas and passed through the glow discharge reaction tube under the same operating conditions. The gaseous concentration of the dopants used was between about $5 \times 10^{-6}$ and $10^{-2}$ parts per volume. The material so deposited included supposedly substitutional phosphorus or boron dopant and was shown to be extrinsic and of n or p conduction type.

While it was not known by these researchers, it is now known by the work of others that the hydrogen in the silane combines at an optimum temperature with many of the dangling bonds of the silicon during the glow discharge deposition, to substantially reduce the density of the localized states in the energy gap toward the end of making the electronic properties of the amorphous material approximate more nearly those of the corresponding crystalline material.

The incorporation of hydrogen in the above method not only has limitations based upon the fixed ratio of hydrogen to silicon in silane, but, more importantly, various Si:H bonding configurations introduce new antibonding states which can have deleterious consequences in these materials. Therefore, there are basic limitations in reducing the density of localized states in these materials which are particularly harmful in terms of effective p as well as n doping. The resulting density of states of the silane deposited materials leads to a narrow depletion width, which in turn limits the efficiencies of solar cells and other devices whose operation depends on the drift of free carriers. The method of making these materials by the use of only silicon and hydrogen also results in a high density of surface states which affects all the above parameters.

After the development of the glow discharge deposition of silicon from silane gas was carried out, work was done on the sputter depositing of amorphous silicon films in the atmosphere of a mixture of argon (required by the sputtering deposition process) and molecular hydrogen, to determine the results of such molecular hydrogen on the characteristics of the deposited amorphous silicon film. This research indicated that the hydrogen acted as an altering agent which bonded in such a way as to reduce the localized states in the energy gap. However, the degree to which the localized states in the energy gap were reduced in the sputter deposition process was much less than that achieved by the silane deposition process described above. The above described p and n dopant gases also were introduced in the sputtering process to produce p and n doped materials. These materials had a lower doping efficiency than the materials produced in the glow discharge process. Neither process produced efficient p-doped materials with sufficiently higher acceptor concentrations for producing commercial p-n or p-i-n junction devices. The n-doping efficiency was below desirable acceptable commercial levels and the p-doping was particularly undesirable since it reduced the width of the band gap and increased the number of localized states in the band gap.

The prior deposition of amorphous silicon, which has been altered by hydrogen from the silane gas in an attempt to make it more closely resemble crystalline silicon and which has been doped in a manner like that of doping crystalline silicon, has characteristics which in all important respects are inferior to those of doped crystalline silicon. Thus, inadequate doping efficiencies and conductivity were achieved especially in the p-type material, and the photovoltaic qualities of these silicon alloy films left much to be desired.

Greatly improved amorphous silicon alloys having significantly reduced concentrations of localized states in the energy gaps thereof and high quality electronic properties have been prepared by glow discharge as fully described in U.S. Pat. No. 4,226,898, Amorphous Semiconductors Equivalent to Crystalline Semiconductors, Stanford R. Ovshinsky and Arun Madan which issued Oct. 7, 1980, and by vapor deposition as fully described in U.S. Pat. No. 4,217,374, Stanford R. Ovshinsky and Masatsugu Izu, which issued on Aug. 12, 1980, under the same title. As disclosed in these patents, which are incorporated herein by reference, fluorine is introduced into the amorphous silicon semiconductor-to substantially reduce the density of localized states therein. Activated fluorine especially readily diffuses into and bonds to the amorphous silicon in the amorphous body to substantially decrease the density of localized defect states therein, because the small size of the fluorine atoms enables them to be readily introduced into the amorphous body. The fluorine bonds to the dangling bonds of the silicon and forms what is believed to be a partially ionic stable bond with flexible bonding angles, which results in a more stable and more efficient compensation or alteration than is formed by hydrogen and other compensating or altering agents. Fluorine is considered to be a more efficient compensating or altering element than hydrogen when employed alone or with hydrogen because of its exceedingly small size, high reactivity, specificity in chemical bonding, and highest electronegativity. Hence, fluorine is qualitatively different from other halogens and so is considered a super-halogen.

As an example, compensation may be achieved with fluorine alone or in combination with hydrogen with the addition of these element(s) in very small quantities (e.g., fractions of one atomic percent). However, the amounts of fluorine and hydrogen most desirably used are much greater than such small percentages so as to form a silicon-hydrogen-fluorine alloy. Such alloying amounts of fluorine and hydrogen may, for example, be in the range of 1 to 5 percent or greater. It is believed that the new alloy so formed has a low density of defect states in the energy gap than that achieved by the mere neutralization of dangling bonds and similar defect sates. Such larger amount of fluorine, in particular, is believed to participate substantially in a new structural configuration of an amorphous silicon-containing material and facilitates the addition of other alloying materials, such as germanium. Fluorine, in addition to its other characteristics mentioned herein, is believed to be an organizer of local structure in the silicon-containing alloy through inductive and ionic effects. It is believed that fluorine also influences the bonding of hydrogen by acting in a beneficial way to decrease the density of defect states which hydrogen contributes while acting as a density of states reducing element. The ionic role that fluorine plays in such an alloy is believed to be an important factor in terms of the nearest neighbor relationships.

As disclosed in the aforementioned referenced U.S. Pat. No. 4,217,374, new and improved amorphous semiconductor alloys and devices can be made which are stable and composed of chemical configurations which are determined by basic bonding considerations. One of these considerations is that the material is as tetrahedrally bonded as possible to permit minimal distortion of the material without long range order. Fluorine, for example, when incorporated into these alloy materials, performs the function of promoting tetrahedral bonding configurations. Amorphous semiconductor materials having such tetrahedral structure exhibit low densities of dangling bonds making the materials suitable for photovoltaic applications.

Hydrogen, while smaller than fluorine, is by far less reactive. Hydrogen, as a result, in addition to promoting tetrahedral bonding, also promotes other various possible bonding configurations which can introduce defects into the material. For example, $H_2Si$ bonds are possible. These bonds are weak bonds which can thermally be broken leaving behind dangling bonds. Also, hydrogen requires rather precise substrate temperature control during deposition to promote the preferred tetrahedral bonding. Therefore, hydrogen in small amounts, in conjunction with fluorine in small amounts should make the optimal amorphous semiconductor alloy. It is not hydrogen as a molecule or fluorine as a molecule, however, which is able to perform these functions. It is atomic hydrogen and atomic fluorine which does. From a chemical point of view in the plasma these species exist as free atoms or free radicals.

Amorphous semiconductor alloys made by the afore-described processes have demonstrated photoresponsive characteristics ideally suited for photovoltaic applications. These prior art processes however suffered from relatively slow deposition rates and low utilization of the reaction gas feed stock which are important considerations from the standpoint of making photovoltaic devices from these materials on a commercial basis. To alleviate the problem of slow deposition rate, a microwave plasma deposition processes was invented by Ovshinsky, et al. See U.S. Pat. No. 4,517,223, Method of Making Amorphous Semiconductor Alloys and Devices Using Microwave Energy, which issued on May 14, 1985, the disclosure of which is hereby incorporated by reference. The microwave plasma process herein provides substantially increased deposition rates and reaction gas feed stock utilization. Further, the microwave process resulted in the formation of reactive species not previously obtainable in sufficiently large concentrations with other processes. As a result, new amorphous semiconductor alloys could be produced having substantially different material properties than previously obtainable.

The principal advantage that microwave (e.g., 2.45 GHz) generated plasmas have over the more widely used radio frequency (e.g., 13.56 MHz) generated plasmas is that the thin film deposition rates are generally higher by factors of 10 to 100. This enhanced rate comes about because of the increased fraction of all the electrons in the plasma which have the necessary energy to be chemically relevant, i.e., energies greater than about 3 to 4 eV in which to excite molecules, and especially energies greater than 8 to 12 eV in which to dissociate and/or to ionize molecules. In other words, for the same power densities, microwave plasmas are more effective in generating the chemically active species (i.e., excited molecules, dissociated, very reactive radicals, ions, etc.), which are necessary to form thin films, than are radio frequency plasmas. One obstacle that has prevented thin film microwave plasma deposition from being more widely used is that the thin film material properties (e.g., electronic, density, etc.) tend to be inferior to those deposited by radio frequency plasma.

More recently, dual-frequency plasma deposition has been investigated as a method for simultaneously combining the advantageous features of both microwave and radio frequency plasma depositions. That is, while microwave plasma is very efficient for generating active. species in the gas phase (because of a relatively higher population of electrons in the energetic tail of the electron energy distribution function), resulting in deposition rates an order of magnitude higher than those observed at lower frequencies, the quality of the deposited material is lacking. On the other hand, radio frequency plasma is characterized by a negative d.c. bias at the cathode, which controls the flux and energy of ions impinging on the cathode surface, resulting in high quality thin film deposition, but at very low deposition rates. Dual-frequency plasma deposition using both microwave energy at 2.45 GHz and radio frequency energy at 13.56 MHz has been shown to produce better quality thin films than microwave energy alone at a higher deposition rate than radio frequency energy alone. See Klemberg-Sapieha et al, "DUAL MICROWAVE-R.F. PLASMA DEPOSITION OF FUNCTIONAL COATINGS", Thin Solid Films, vol. 193/194, December, 1990, pages 965–972.

Although this dual-frequency (ELF) plasma deposition method clearly has advantages over single frequency microwave (MW) or radio frequency (RF) plasma, it clearly only a compromise. While DF plasma has higher deposition rates than RF plasma, the rates are unquestionably lower those of MW plasma. Also, while the quality of DF plasma deposited films is greater than those deposited by MW plasma, it is undoubtedly lower than those deposited by RF plasma. It has been found that at the higher deposition rates of MW plasma deposition, it becomes increasingly important that the active neutrals (i.e. chemically activated, electrically neutral species) have higher kinetic energy so that when they arrive at the film surface, they will have the necessary surface mobility to create a high quality film.

In the discussion of microwave plasma deposition above attention should be focused on the electrons, for it is the electrons, which excite, dissociate and ionize the gaseous molecules. One possible mechanism why microwave energy leads to higher electronic energy in the plasma is that the electrons can resonantly couple to the energy. For example, in typical microwave plasmas, the electron density can range from $10^{10}$ to $10^{11}$ per $cm^3$. At these densities, the resulting plasma oscillation frequency is on the same order as the applied radiation, namely in the low GHz range. Although a tremendous amount of the energy of the high frequency radiation can be pumped into the electrons by resonantly coupling, little if any of that energy can be transferred into kinetic energy of the ions and neutral molecules. This is because the ions are too massive to respond to the high frequency oscillations of the microwave and/or radio frequency energy, and also the energy gain of the electrons cannot be effectively transferred to the ions/neutrals due to the their large difference in mass.

There are two ways to resonantly couple energy into a plasma: (a) by high frequency radiation, which couples into the electrons; and (b) by low frequency radiation, which couples into the ions. When energy is pumped into the ions, their energy is very effectively transferred into the neutrals owing to their similarity in masses. Heating of the neutrals is desirable because it is the neutrals which overwhelmingly account for the deposition rate. It should be noted that because a relatively few ions must heat a large number of neutrals, efficiency requirements dictate the need to resonantly couple energy into the ions.

Large scale uniform deposition in rf plasma systems is not a serious issue because the wavelength at 13.56 MHz is more than 22 m, i.e., much greater than any practical deposition chamber. However, since the wavelength at the microwave frequency of 2.45 GHz is only 12.2 cm, the technical challenges in achieving uniform depositions over the desired scale of 30 cm are evident. Because of this, deposition results (e.g., film quality from a certain point in parameter space) obtained from small sized microwave research reactors (~5 cm substrates), cannot be automatically applied to the larger production systems because the hardware implementation will be fundamentally different. Scaling the process to larger sizes is not simply a matter of making larger electrodes (as it is in rf plasma systems) but involves new concepts. Although others have demonstrated high quality a-Si:H films with solar cell efficiencies approaching the best rf deposited material, similar results on the large production scale have yet to be demonstrated.

In the past, two types of microwave applicators were developed for different purposes. The first was a "single point" applicator, and the second was a "multi point" or "linear" applicator. The term "single point" refers to the fact that the microwaves emanate from only one region of space whose dimension is on the order of one wavelength. On the other hand, the "multi point" term refers to a system whereby the microwave energy emanates over a region of space extending over many (or multiple) wavelengths.

A) Microwave Feed-Through

The single point Applicator was developed for the purpose of coating xerographic drums. This device serves two basic purposes: (1) as a vacuum microwave feed-through or window; and (2) as the actual emanation or "launch" area where microwave energy is input into the plasma region. It consists of two alumina disks and one vitreous silica "quartz" disk which facilitates water cooling. Microwave energy enters from the air side and passes first through the quartz disk, and then through the two alumina disks before entering into the vacuum deposition chamber. The first alumina disk serves as the primary vacuum sealing component. The second alumina disk is in intimate contact with the first, and is directly exposed to the plasma region. Since this disk is removable, any build-up occurring during the deposition process can be easily removed. As the microwave energy passes through the window, into the plasma region, its energy is consumed in the plasma generation process, so that the microwave energy available for plasma production falls off exponentially in distance from the window. Thus, the corresponding drop in plasma intensity results in a fall off of the deposition rate with distance from the window. In the xerography application, deposition uniformity over the length of the drum required that two windows be used, one at each end of the drum.

This MW feed-through device was not designed as a high transmission device, i.e., one matching the transmission line (wave guide) impedance to the impedance of the deposition region. This was because of the difficulty in matching a fixed impedance device (wave guide) to the highly variable impedance of a plasma. It was however designed to withstand the high temperature effects associated with direct exposure to high power (about 5 kW or more) microwave plasmas. As microwave energy travels down the wave guide, the feed-through reflects some of the energy simply because of the change in impedance (i.e., refractive index) caused by the dielectric (quartz and alumina) plates. But the plasma will further modify the total input impedance so that the reflection of energy is not solely determined by the feed-through characteristics. Note that basic tuning can be accomplished with a 4-stub tuner located between the feed-through and the microwave generator. But even though it is possible to reduce the reflected power to very low levels, e.g., <100 W as measured on the microwave generator side of the tuning device, this does not always assure that more energy is actually being delivered into the plasma region, for much of the tuning action of the tuner tends to be resistive (loss of power) in nature.

In addition to the successful use of this Applicator (feed-through) in xerographic drum production, it has also been used successfully in small research reactors and capable of producing high quality a-Si:H films for solar cells. But geometrical considerations make adapting this applicator to large area roll to roll solar cell production method unsuitable. In addition, more than one microwave generator would be required.

B) Microwave Linear Applicator

The multi point or linear applicator was developed for the coating of dielectric films over dimensions much larger than the microwave wavelength using a single power source. This device consists of a section of wave guide that contains a number of apertures on one of its faces. The efficiency of radiation at each point is determined by the size of the aperture from which the microwaves emanate. Uniformity of the radiation is therefore controlled by adjusting the aperture sizes. As microwaves enter into the Applicator, the energy density is greatest for the first aperture that is encountered. Because some energy has radiated away, the amount of energy traveling along the guide is diminished. The energy density at the next aperture is, therefore, less than at the first. To ensure that the total energy radiated from the second aperture is similar to the first, its size must be correspondingly larger. Uniformity along the length of the applicator is obtained by having progressively larger apertures.

This linear applicator is installed within a large vitreous silica (quartz) tube which serves as the vacuum seal/microwave feed-through. The inside of the tube is at atmospheric pressure while the outside is sealed to the vacuum deposition chamber, such that the applicator is actually at atmospheric pressure. Since the wave guide is directly connected to the applicator, and since the applicator is essentially a piece of wave guide, there is only a small impedance mismatch between them. This means that a tuning device is not needed between the applicator and the microwave generator.

Since the outside surface of the quartz tube is directly exposed to the plasma deposition region, the tube will become coated with whatever materials are being deposited within the chamber. When the depositing materials is a dielectrics such as $SiO_2$ or $Si_3N_4$, there are no detrimental consequences from the deposition thereof onto the quartz tube, due to the non microwave absorbing nature of these materials. However, for materials such as a-Si:H and a-Si:Ge:H alloys, even small deposited layers cause microwave absorptions which can lead to excessive heating of the quartz tube. This heating can eventually lead to crystallization of the deposited material which, in turn, dramatically increases the microwave absorption of the deposited layer. Failure of the quartz tube becomes imminent when the deposited material heats up to the melting point of quartz which can be catastrophic when dealing with pyrophoric silane gases.

Another consideration when using the quartz tube involves its serviceability. Since the large tube is a major vacuum component of the deposition system, replacement of the tube requires the system to be He leak checked. This time consuming process would be required before each production run.

In summary, the single point applicator (microwave feed-through) is a rugged and safe way to introduce high power microwaves into the low pressure deposition chamber. However, it is not particularly suited for large area depositions and, in any event, would require more than one microwave generator to accomplish large area deposition. On the other hand, the multi point (linear) applicator requires only one microwave generator for large area depositions, but would involve a dangerous use of a microwave window when producing a-Si:H and a-Si:Ge:H films.

Therefore, there is still a strong felt need in the art for a rugged and safe method of applying microwaves to the plasma deposition region in the vacuum chamber for large area deposition. There is also still a need in the art for a large area deposition method which combines the very high deposition rate of microwave plasma deposition with the high quality deposited films of RF plasma deposition.

SUMMARY OF THE INVENTION

A first aspect of the present invention is an improved microwave vacuum feed-through device for coupling microwave energy from a microwave wave guide in a substantially atmospheric pressure region into an elongated linear microwave applicator in a sub-atmospheric pressure region. The feed-through device is characterized by the ability to couple microwave energy, input thereto from said microwave wave guide, into said linear microwave applicator with substantially zero microwave energy reflected from said feed-through device back into said microwave wave guide and 95% or more of the microwave energy input to said feed-through device coupled into said linear applicator. The improved feed-through includes a feed-through body comprising a hollow chamber, a wave guide connector attached to one end of the feed-through body and adapted to allow for a microwave tight seal between the wave guide and the feed-through body, a linear microwave applicator connector attached to the end of the feed-through body opposite the wave guide connector and adapted to allow for a microwave tight seal between the linear microwave applicator and the feed-through body, and three or more dielectric, microwave transmissive plates positioned within the feed-through body, the plane of the plates being perpendicular to the direction of travel of microwave energy through the feed-through. The thickness of each plate, the composition of the plates, the interplate spacing and the composition of the environment between said plates being adjusted to match the impedance of the feed through with the impedance of the wave guide and the linear applicator.

Preferably, the dielectric, microwave transmissive plates are three alumina plates which are spacedly disposed within the feed-through body such that a first plate is spacedly disposed from the wave guide connector, a second plate is spacedly disposed from the first plate, and a third plate is spacedly disposed between the second plate and the linear microwave applicator connector. More preferably, the second alumina plate is twice as thick as the first and third plates and the second alumina plate serves as the point at which a vacuum seal between is formed between the atmospheric pressure region and the sub-atmospheric pressure region by inserting a teflon seal between the edges of the second alumina plate and the interior wall of the feed-through body. The space between the first and second alumina plates is filled with air while the space between the second and the third plates is a vacuum.

A second aspect of the present invention is an improved linear microwave applicator for uniformly coupling 95% or more of the microwave energy input thereto into an elongated plasma zone. The improved linear applicator includes an applicator body which is an elongated piece of microwave wave guide, a microwave radiative slot is formed in the applicator body through which input microwaves radiate into the elongated plasma zone, the radiative slot has a constant width and extends a substantial portion of the length of the applicator body. The applicator also includes a connector attached to one end of the applicator body, the connector being adapted to allow for a microwave tight seal between the applicator body and a microwave vacuum feed-through, and further includes microwave reflectors attached to the applicator body, the reflectors being adapted to reflect a portion of the microwave energy radiated from any point in the radiative slot back into the applicator body such that the reflected portion can be reradiation at a different point along the radiative slot, thereby allowing for tuning of the uniformity of the radiated microwave energy intensity along the entire length of the radiative slot Preferably the applicator body is a rectangular microwave wave guide and the radiative slot is formed in one of the wider faces thereof. Also, preferably, the microwave reflectors comprise a pair of curved microwave reflecting panels, each of the panels being attached to the rectangular applicator body on opposed narrower faces thereof and extending outward from the body in a direction generally parallel to the plane of said narrower faces and curving outward toward the elongated plasma zone. The curved panels are curved in the same direction relative to one another but with different radii of curvature and the uniformity of the radiated microwave energy intensity along the entire length of the radiative slot is adjusted by adjusting the curvature of the panels. One or more cooling medium channels are attached to the wider face of the applicator body opposite the slot.

A third aspect of the present invention is a microwave enhanced chemical vapor deposition method for depositing thin film material. The method includes the steps of providing a vacuum chamber; placing a substrate inside the chamber; evacuating the chamber to sub-atmospheric pressure; providing a source of microwave energy; introducing reaction gas into the chamber adjacent the substrate; directing the microwaves from the source of microwave energy into the chamber in the vicinity of the reaction gas, thereby forming a plasma of electrons, ions and activated electrically neutral species; intensifying the kinetic/thermal energy of the electrically neutral species in the plasma; and depositing thin film onto the substrate.

Preferably the step of intensifying the kinetic/thermal energy of the electrically neutral species includes intensifying the kinetic/thermal energy of the ions in the plasma and thereby, through ion-neutral collisions, intensifying the kinetic/thermal energy of the electrically neutral species and the step of intensifying the kinetic/thermal energy of the ions in the plasma includes subjecting the plasma to either a very low frequency alternating current electrical bias or an alternating polarity magnetic field. More preferably the very low frequency alternating current electrical bias or the alternating polarity magnetic field has a frequency of less than about 100 KHz and the very low frequency alternating current electrical bias has a power of less than about 100 Watts. Typically, the microwave energy is supplied at a frequency of 2.54 GHz and at a power of about 2 kiloVatts. Alternatively, the step of intensifying the kinetic/thermal energy of the electrically neutral species includes bombardment of the plasma by an external source of high kinetic/thermal energy ions and the resultant ion-neutral collisions.

Additional objectives and aspects of the instant invention will be obvious from the detailed description, claims and drawings appended hereto.

DETAILED DESCRIPTION OF THE INVENTION

Under certain circumstances, the quartz tube window of the prior art linear applicator could, conceivably, fail catastrophically. In the microwave deposition apparatus of the instant invention, a modified Linear Applicator is placed inside the vacuum environment and a modified single point microwave vacuum feed-through is used to supply microwave energy to the applicator. In this way, the only vacuum window is the relatively small one in the microwave feed-through itself.

Figure 1:
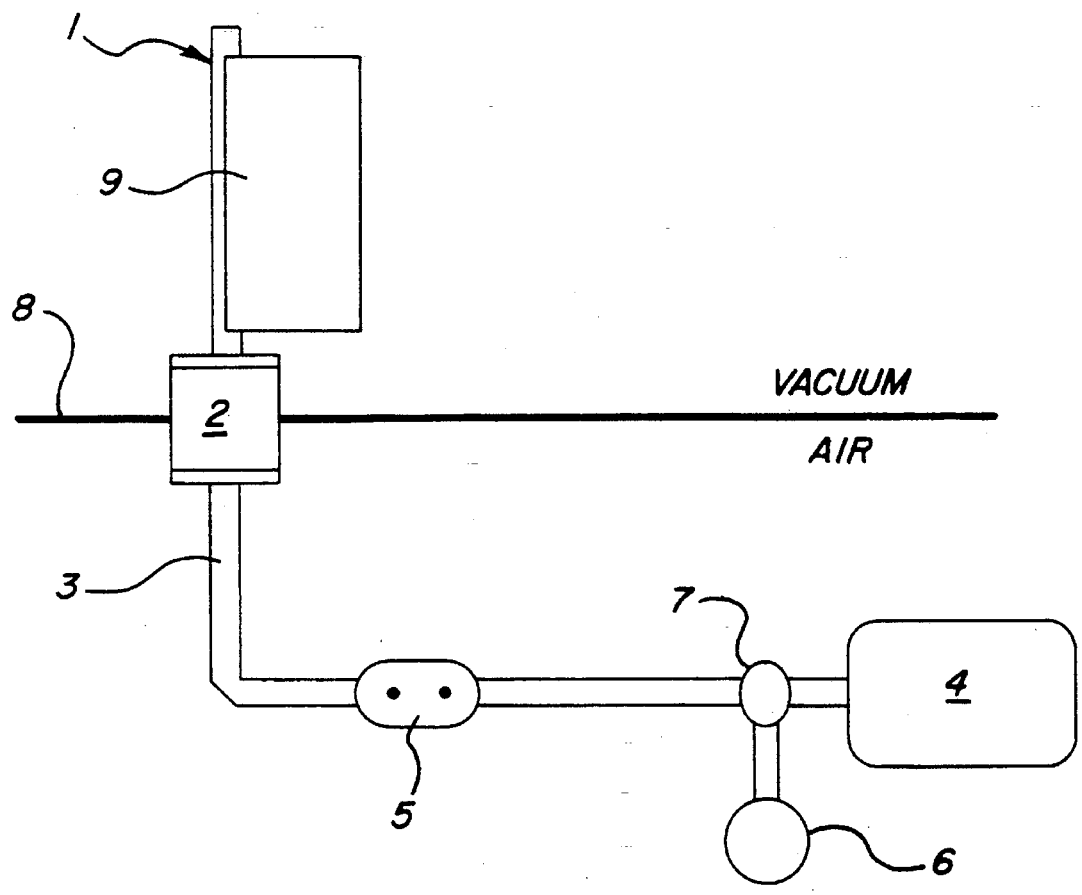
FIG. 1 is a partial schematic diagram, not to scale, of a microwave deposition apparatus according to the present invention, specifically depicting the improved vacuum feed-through and the improved linear applicator of the present invention.

FIG. 1 is a schematic depiction of a microwave deposition system including the improved microwave vacuum feed-through 2 and improved linear applicator 1 of the instant invention. Microwaves (typically at a frequency of 2.54 GHz and a power of about 2 kWatts), are created in microwave generator 4. These microwaves travel along the microwave wave guide 3, passing through circulator 7. The circulator 7 prevents any reflected microwave energy from entering the microwave generator by passing the reflected energy to the dummy load 5. The microwave energy created in the generator 4 also passes through a microwave power meter 5, which measures the forward and reflected microwave power. Next the microwave energy passes through the improved microwave vacuum feed-through 2 which provides the vacuum-to-air seal at the deposition chamber wall 8. Finally the microwave energy passes into the improved linear applicator 1 of the present invention. As the microwave energy exits the applicator 1, some of the energy is reflected back into the applicator 1 by reflectors 9 and is reradiated at another point along the applicator.

Figure 2:
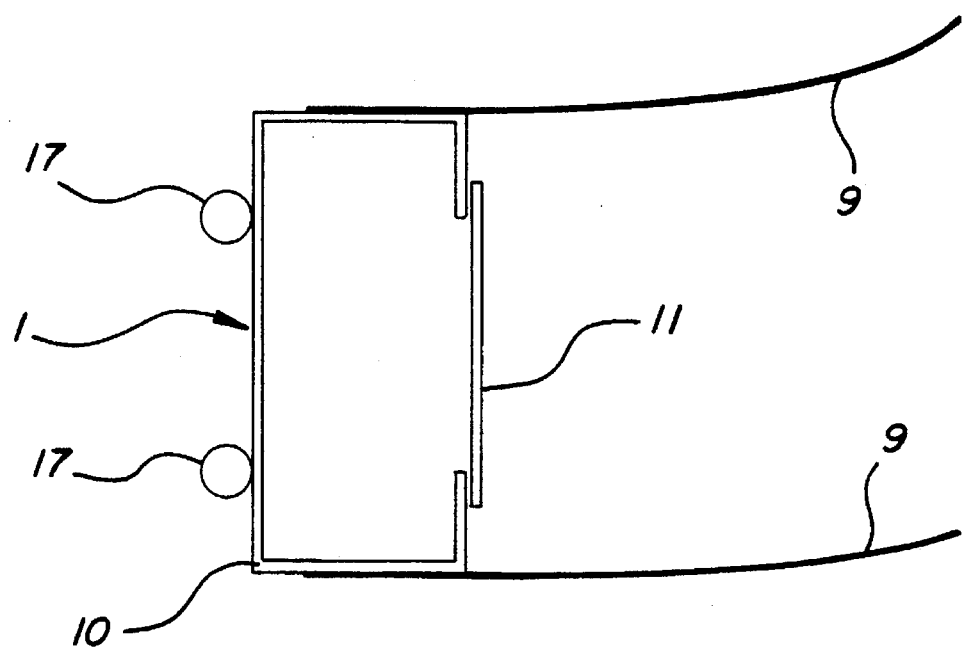
FIG. 2 is a top view, not to scale, of the improved linear microwave applicator of the present invention, specifically illustrating the microwave reflecting panels.
Figure 3:
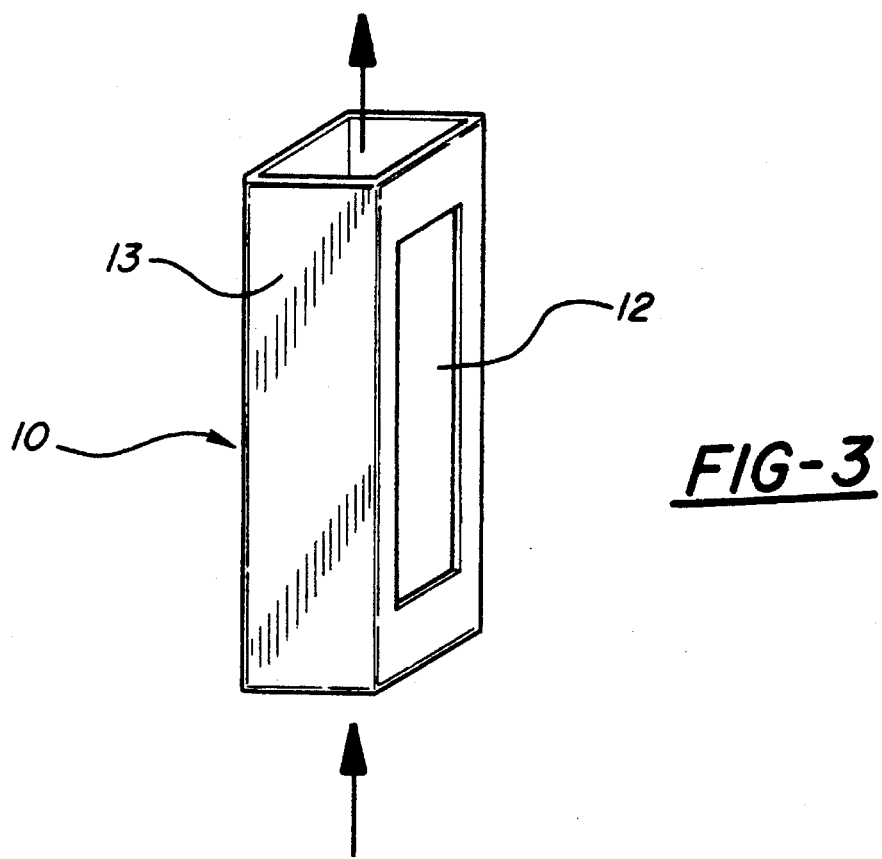
FIG. 3 is a partial side view, not to scale, of the microwave wave guide portion of the linear microwave applicator of the present invention, specifically illustrating the rectangular wave guide portion of the applicator and the microwave radiative slot formed in one of the wider faces thereof.

Turning now to FIGS. 2 and 3, there is depicted therein a top and side view of the improved linear applicator of the instant invention, respectively. FIG. 2 specifically illustrates the reflector panels 9 and the curvature thereof. Also illustrated in FIG. 2 is the rectangular applicator wave guide body 10. The applicator is cooled, as needed, by passing cooling fluid through channels 17 which are attached to the applicator body 10 on the wider face thereof which is opposite that in which the includes the radiative slot (reference numeral 12 of FIG. 3). Covering the radiative slot (12) is a loose fitting quartz plate 11.

Normally, one would expect that since the applicator body wave guide 10 is inside the vacuum environment, plasma would be produced on the inside of the wave guide as microwave energy travels therein. However, it has been found that this is not necessarily so. The formation of the plasma has been found to depend on the pressure within the waveguide. If the pressure is sufficiently low (i.e., less than about 1 mTorr) magnetic confinement then becomes necessary to sustain a plasma. In the operation of the system of the present invention, the average pressure within the applicator body is about 1 mTorr. The microwaves travel up the wave guide body 10 of the linear applicator and radiate out the radiative slot 12 on one side of the guide into a region of slightly higher pressure nearer the gas feed manifold (not shown). A loose fitting quartz plate 11 separates the inside of the guide body 10 from the region of elevated pressure. This plate 11 is neither a structural element, nor a major vacuum component.

Returning now to FIGS. 2 and 3, the wave guide 10 is a standard 1.5×3.0 in. guide. A slot 12 is cut along the length of the guide in the z-direction (large dark arrows in FIG. 3) on one of the wider faces thereof (i.e., the 3 in. side). It should be noted that the width of the slot is uniform along the entire length thereof. With respect to FIG. 3, the microwaves enter the bottom of the Applicator wave guide 10 from the feed-through (reference numeral 2 of FIG. 1), and radiate out the slot 12. Excess microwave energy not radiated out the slot is (normally) transmitted to the top of the guide (where it also radiates). If the slot is wide enough, and/or the length of the slot is long enough, no energy remains at the top of the guide. It should also be noted that, without the reflector fins 9 and, because the slot 12 is of uniform width, the energy radiated out of the slot 12 decays exponentially from bottom to top thereof.

The exponentially decaying property occurs when there is only radiating energy, i.e., only outward going microwave energy. The installation of the reflecting panels 9 plays an important role in creating uniformity of the radiating microwave energy, because they introduce another term to the radiation picture. That is, a reflected, inward traveling component of microwave energy. These panels 9, are attached on each of the narrower sides 13 of the applicator body 10 and curvedly extend past the face containing the long slot 12 toward the plasma zone. The curved panels 9, are formed of a microwave reflecting material such as stainless steal and reflect a portion of the outgoing microwave energy back into the applicator wave guide body 10. In the present configuration, the width of the slot 12 is such that after 15 inches of slot, about 50% of the energy is transmitted to the top of the guide. However, the wave nature of microwaves is shown dramatically when one of the panels 9 is slowly brought into place. It has been found that the energy transmitted out the top of the waveguide body 10 drops down to only 30% and that as the other panel 9 is then brought into place, the energy transmitted out the top drops to near 0%, with only about 5% reflected back out the bottom of the applicator body 10. In other words, the installation of the reflecting panels 9 has actually increased the amount of microwave energy which is radiated out of the radiative slot 12). Curvature of the panels 9 is important to achieve the desired level of tuning, but the panels 9 are not required to be touching the sides 13 of the wave guide body 10. It has been found that the same results are obtained even when there is a small gap between the guide body 10 and the reflecting panels 9. Also, the loose quartz plate 11 shown in FIG. 2 does not qualitatively change the microwave radiation uniformity.

It is clear from the above discussion that uniformity is an inherent aspect of the linear applicator of the present invention. If one location along the slot 12 radiates more strongly than neighboring positions, there is then correspondingly more radiation to be reflected and fed back into the wave guide body 10. This energy can then be redistributed to other locations along the applicator 1. Uniformity of deposition has been measured to +/−5% over a distance of 12 inches.

Figure 4:
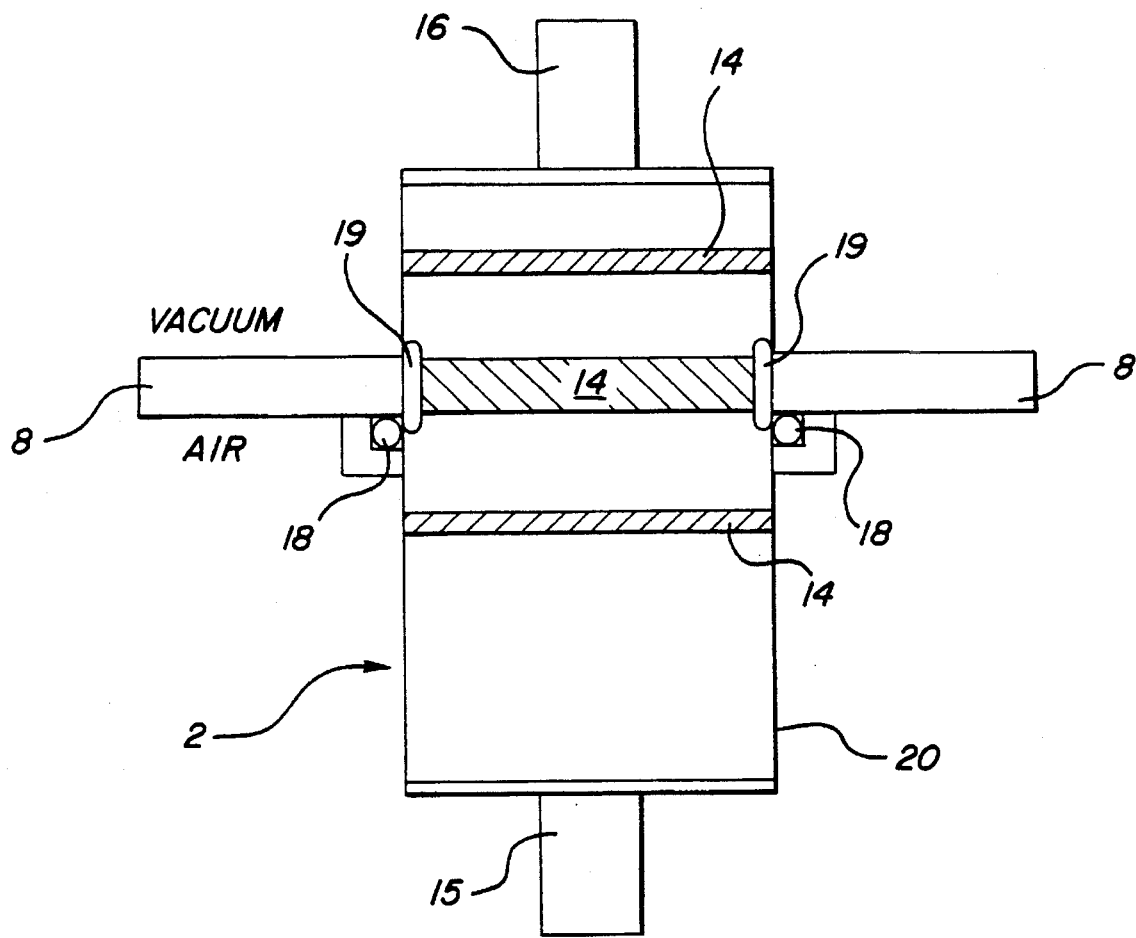
FIG. 4 is a cross sectional side view, not to scale, of the microwave vacuum feed-through of the instant invention, specifically illustrating the microwave transmissive plates and the vacuum seals for isolating the interior vacuum from the exterior atmosphere.

Turning now to FIG. 4, there is depicted therein a cross sectional side view of the improved microwave vacuum feed-through of the present invention. The prior an microwave feed-through was designed to withstand the high temperature problems of direct exposure to the plasma, and its transmission property was not then of concern. Direct use of the prior-art feed-through in the system of FIG. 1 showed that a large impedance mismatch existed between the feed-through 2, the wave guide 3 and the linear applicator 1. High power measurements showed that for 5 kW incident from the MW generator, 2 kW were reflected by the feed-through so that 3 kW (at the most) were being delivered into applicator. Low power bench top measurements confirmed that 40% of the incident power was reflected. Those same measurements showed that only about 35% of the incident power was successfully coupled into the applicator wave guide 10. The remaining 25% was lost to radiation and/or to resistive losses at the connection between the applicator 1 and the feed-through 2.

Therefore, a the microwave vacuum feed-through of the instant invention has been constructed to use constructive and destructive interference (i.e. the wave nature of microwaves) to eliminate the reflected portion of the microwave energy by impedance matching the feed-through 2, to the wave guide 3 and the applicator 1. The microwave feed-through 2 includes a feed-through body 20 which is essentially a hollow cylindrical chamber, although, if needed, a cooling jacket can be used to eliminate any possible heating problems. Within the body 20, is three or more dielectric plates 14. In a preferred the dielectric plates consist of three 4 in. OD alumina disks which are each separated by a particular distance. Each of the spacings between the disks is different from the others and the optimum spacing is determined empirically to tune the impedance of the feed-through 2. The middle disk is preferably twice as thick as the other two disks and serves as the point to which the vacuum seal is made by a Teflon o-ring 19. Therefore, the spaces between the middle disk 14 and the linear applicator connection means 16 are under vacuum while the spaces between the middle disk 14 and the wave guide connection means 15 are filled with air. It should be noted here that all the materials which are placed within the feed-through body 20 must be microwave compatible.

The connection means 15 and 16 are formed such that a microwave tight seal is formed between said means and the wave guide 3 and the applicator 1 respectively. The feed-through also includes Viton o-ring sealing means 18 to provide a vacuum seal, at the chamber wall 8, between the interior vacuum region and the exterior air region.

Low power bench top measurements showed that the feed-through 2 of the present invention coupled up to 95% of the incident energy from the outer wave guide 3 to the applicator wave guide 10, with no detectable reflection. High power measurements (<3 kW) into a dummy load (i.e., no plasma conditions) confirmed the low power results. The unaccounted 5% is most likely due to resistive losses on the inside of the feed-through. With the nearly perfect transmission, a "transparent connection" has been achieved between the wave guide transmission line 3 and the applicator wave guide 10.

As was stated hereinabove, there are two ways to resonantly couple energy into a plasma: (a) by high frequency radiation, which couples into the electrons; and (b) by low frequency radiation, which couples into the ions. When energy is pumped into the ions, their energy is very effectively transferred into the neutrals owing to their similarity in masses. Heating of the neutrals is desirable because it is the neutrals which overwhelmingly account for the deposition rate. It should be noted that because a relatively few ions must heat a large number of neutrals, efficiency requirements dictate the need to resonantly couple energy into the ions.

The third aspect of the instant invention set forth a microwave deposition method which couples extra low frequency energy into the positive ions of a microwave plasma. The method essentially incorporates a very low frequency biasing into a traditional microwave deposition technique.

The method of the present invention includes the steps of providing a vacuum chamber, placing a substrate inside the chamber, evacuating the chamber to sub-atmospheric pressure; providing a source of microwave energy; introducing reaction gas into the chamber adjacent the substrate; directing the microwaves from the source of microwave energy into the chamber in the vicinity of the reaction gas, thereby forming a plasma of electrons, ions and activated electrically neutral species; intensifying the kinetic/thermal energy of the electrically neutral species in the plasma; and depositing thin film onto the substrate.

Preferably the step of intensifying the kinetic/thermal energy of the electrically neutral species includes intensifying the kinetic/thermal energy of the ions in the plasma and thereby, through ion-neutral collisions, intensifying the kinetic/thermal energy of the electrically neutral species. That is, by increasing the kinetic energy of the ions of the plasma, the resulting ion-neutral collisions (where the masses of the ions are on the same order as those of the neutrals) will increase the kinetic energy of the neutrals significantly.

The step of intensifying the kinetic/thermal energy of the ions in the plasma includes subjecting the microwave plasma to either a very low frequency alternating current electrical bias or an alternating polarity magnetic field. In either case, the frequency of alternation (electrical of magnetic) is chosen to couple into the oscillation frequency (i.e collision frequency) of the ions of the plasma. The very low frequency alternating current electrical bias or the alternating polarity magnetic field typically has a frequency of less than about 100 KHz and the very low frequency alternating current electrical bias has a power of less than about 100 Watts. Also, as is typical of the prior art microwave depositions, the microwave energy is supplied at a frequency of 2.54 GHz and at a power of about 2 kiloWatts.

Alternatively, the step of intensifying the kinetic/thermal energy of the electrically neutral species can include bombardment of the plasma by an external source of high kinetic/thermal energy ions, with resultant ion-neutral collisions and impartation of kinetic energy to plasma ions and neutral alike.

Modifications and variations of the present invention are possible in light of the above teachings. It is therefore to be understood that within the scope of the appended claims the invention may be practice otherwise than as specifically described.

We claim:

1. A microwave energy feed-through device for coupling microwave energy from a microwave wave guide in a substantially atmospheric pressure region into an elongated linear microwave applicator in a sub-atmospheric pressure region;

said feed-through device characterized by the ability to couple microwave energy, input thereto from said microwave wave guide, into said linear microwave applicator with substantially zero microwave energy reflected from said feed-through device back into said microwave wave guide and 95% or more of the microwave energy input to said feed-through device coupled into said linear applicator;

said feed-through including:
a) a feed-through body, said body comprising a hollow chamber,
b) a wave guide connection means attached to one end of said feed-through body, said wave guide connection means adapted to allow for a microwave tight seal between said wave guide and said feed-through body;
c) a linear microwave applicator connection means attached to the end of said feed-through body opposite the wave guide connection means, said linear microwave applicator connection means adapted to flow for a microwave tight seal between said linear microwave applicator and said feed-through body; and d) three or more dielectric, microwave transmissive plates positioned within said feed-through body, the plane of said plates being perpendicular to the direction of travel of microwave energy; the thickness of each plate, the composition of the plates, the inter-plate spacing and the composition of the environment between said plates all being adapted to match the impedance of the feed through with the impedance of the wave guide and the linear applicator.

2. A microwave energy feed-through device as in claim 1, wherein said dielectric, microwave transmissive plates are three alumina plates.

3. A microwave energy feed-through device as in claim 2, wherein said three alumina plates are spacedly disposed within said feed-through body such that a first plate is spacedly disposed from said wave guide connection means, a second plate is spacedly disposed from said first plate, and a third plate is spacedly disposed between said second plate and said linear microwave applicator connection means.

4. A microwave energy feed-through device as in claim 3, wherein the second alumina plate is thicker than the first and third alumina plates.

5. A microwave energy feed-through device as in claim 3, wherein the space between said first and said second alumina plates is filled with air at atmospheric pressure.

6. A microwave energy feed-through device as in claim 3, wherein the space between said second and said third alumina plates comprises a vacuum.

7. A microwave energy feed-through device as in claim 4, wherein said second alumina plate serves as the point at which a vacuum seal between is formed between the atmospheric pressure region and the sub-atmospheric pressure region by inserting a teflon seal between the edges of said second alumina plate and the interior wall of said feed-through body.

8. An improved linear microwave applicator for uniformly coupling 95% or more of the microwave energy input thereto into an elongated plasma zone, said applicator including:

a) an applicator body, said body comprising of an elongated piece of microwave wave guide;

b) a microwave radiative slot formed in said applicator body through which input microwaves radiate into said elongated plasma zone, said radiative slot having a constant width and extending a substantial portion of the length of the applicator body;

c) a microwave energy feed-through device connection means attached to one end of said applicator body, said feed-through connection means adapted to flow for a microwave tight seal between said applicator body and said feed-through; and d) microwave reflecting means attached to said applicator body, said reflecting means adapted to reflect a portion of the microwave energy radiated from any point in said radiative slot back into said applicator body such that the reflected portion can be reradiation at a different point along said radiative slot, thereby allowing for tuning of the uniformity of the radiated microwave energy intensity along the entire length of the radiative slot.

9. An improved linear microwave applicator as in claim 8, wherein said applicator body comprises a rectangular microwave wave guide and said radiative slot is in one of the wider faces thereof.

10. An improved linear microwave applicator as in claim 9, wherein said microwave reflecting means comprises a pair of curved microwave reflecting panels, each of said panels being attached to the rectangular applicator body on opposed narrower faces thereof and extending outward from said body in a direction generally parallel to the plane of said narrower faces and curving outward toward the elongated plasma zone.

11. An improved linear microwave applicator as in claim 10, wherein both of the curved panels are curved in the same direction relative to one another but with different radii of curvature and the uniformity of the radiated microwave energy intensity along the entire length of the radiative slot is adjusted by adjusting the curvature of the panels.

12. An improved linear microwave applicator as in claim 11, wherein one or more cooling medium channels are attached to the wider face of said applicator body opposite said slot.

* * * * *